United States Patent
Torimi et al.

(10) Patent No.: US 10,388,536 B2
(45) Date of Patent: Aug. 20, 2019

(54) ETCHING METHOD FOR SIC SUBSTRATE AND HOLDING CONTAINER

(71) Applicants: Toyo Tanso Co., Ltd., Osaka-shi, Osaka (JP); KWANSEI GAKUIN EDUCATIONAL FOUNDATION, Nishinomiya-shi, Hyogo (JP)

(72) Inventors: Satoshi Torimi, Kanonji (JP); Masato Shinohara, Kanonji (JP); Youji Teramoto, Kanonji (JP); Norihito Yabuki, Kanonji (JP); Satoru Nogami, Kanonji (JP); Tadaaki Kaneko, Sanda (JP); Koji Ashida, Sanda (JP); Yasunori Kutsuma, Sanda (JP)

(73) Assignees: TOYO TANSO CO., LTD., Osaka-shi (JP); KWANSEI GAKUIN EDUCATIONAL FOUNDATION, Nishinomiya-shi (JP)

( * ) Notice: Subject to any disclaimer, the term of this patent is extended or adjusted under 35 U.S.C. 154(b) by 0 days.

(21) Appl. No.: 15/527,622

(22) PCT Filed: Nov. 17, 2015

(86) PCT No.: PCT/JP2015/005742
§ 371 (c)(1),
(2) Date: May 17, 2017

(87) PCT Pub. No.: WO2016/079983
PCT Pub. Date: May 26, 2016

(65) Prior Publication Data
US 2017/0323797 A1    Nov. 9, 2017

(30) Foreign Application Priority Data
Nov. 18, 2014 (JP) ................ 2014-233631

(51) Int. Cl.
*H01L 21/306* (2006.01)
*H01L 21/67* (2006.01)
(Continued)

(52) U.S. Cl.
CPC ........ *H01L 21/30604* (2013.01); *C30B 29/36* (2013.01); *C30B 33/12* (2013.01);
(Continued)

(58) Field of Classification Search
None
See application file for complete search history.

(56) References Cited

U.S. PATENT DOCUMENTS 9,644,894 B2 * 5/2017 Torimi .................. F27D 5/0037
9,704,733 B2 * 7/2017 Torimi .................... C30B 29/36
(Continued)

FOREIGN PATENT DOCUMENTS

JP   2008-230944 A   10/2008
JP   2010-265126 A   11/2010
(Continued)

OTHER PUBLICATIONS

Extended (supplementary) European Search Report dated Apr. 30, 2018, issued in counterpart European Application No. 15861337.2. (8 pages).
(Continued)

Primary Examiner — Allan W. Olsen
(74) Attorney, Agent, or Firm — Westerman, Hattori, Daniels & Adrian, LLP

(57) ABSTRACT

Provided is a method for controlling the rate of etching of a SiC substrate based on a composition of a storing container. The etching method of the present invention is for etching the SiC substrate by heating the SiC substrate under Si vapor pressure, in a state where the SiC substrate is stored in a crucible. The crucible is formed of a tantalum metal, and has (Continued)

a tantalum carbide layer provided on an internal space side of the tantalum metal, and a tantalum silicide layer provided on the side further toward the internal space side than the tantalum carbide layer. The rate of etching of the SiC substrate is controlled based on difference in a composition of the tantalum silicide layer.

2 Claims, 8 Drawing Sheets

(51) Int. Cl.
*C30B 29/36* (2006.01)
*C30B 33/12* (2006.01)
*H01L 21/302* (2006.01)
*C30B 35/00* (2006.01)

(52) U.S. Cl.
CPC .......... *C30B 35/002* (2013.01); *H01L 21/302* (2013.01); *H01L 21/67063* (2013.01)

(56) References Cited

U.S. PATENT DOCUMENTS

| | | | |
|---|---|---|---|
| 10,014,176 B2 * | 7/2018 | Yabuki | H01L 21/302 |
| 2002/0083890 A1 * | 7/2002 | Vodakov | C30B 23/00 |
| | | | 117/104 |
| 2014/0342553 A1 * | 11/2014 | Chen | H01L 21/76897 |
| | | | 438/666 |
| 2015/0249025 A1 * | 9/2015 | Torimi | F27D 5/0037 |
| | | | 432/198 |
| 2015/0255314 A1 | 9/2015 | Torimi et al. | |
| 2016/0118257 A1 * | 4/2016 | Kaneko | C30B 29/36 |
| | | | 438/492 |
| 2017/0114475 A1 * | 4/2017 | Yabuki | C30B 19/12 |
| 2017/0323792 A1 * | 11/2017 | Yabuki | H01L 21/302 |
| 2017/0345672 A1 * | 11/2017 | Kaneko | H01L 21/0445 |

FOREIGN PATENT DOCUMENTS

| | | |
|---|---|---|
| JP | 2011-233780 A | 11/2011 |
| JP | 2014-103180 A | 6/2014 |
| WO | 2014/076964 A1 | 5/2014 |
| WO | WO-2014076964 A1 * | 5/2014 ............. C30B 29/36 |

OTHER PUBLICATIONS

International Search Report dated Feb. 16, 2016, issued in counterpart International Application No. PCT/JP2015/005742 (2 pages).

* cited by examiner

ETCHING METHOD FOR SIC SUBSTRATE AND HOLDING CONTAINER

TECHNICAL FIELD

The present invention relates mainly to a method for etching a SiC substrate by using a storing container having a tantalum silicide layer that is provided on an internal space side.

BACKGROUND ART

Conventionally, a method for etching a surface of a SiC substrate by heating the substrate that is stored in a storing container under a state where a high-purity Si vapor pressure is caused within the storing container has been conventionally known (Si vapor pressure etching). Patent Documents 1 and 2 disclose this kind of prior art.

Patent Document 1 discloses a method for placing Si pellets (solid Si) in the storing container in order to cause Si vapor pressure within the storing container. Patent Document 2 discloses a method for adhering Si on an inner wall surface in the storing container in order to cause Si vapor pressure within the storing container.

Here, in the method of Patent Document 1, Si pressure distribution may be ununiform. In the method of Patent Document 2, Si that is adhered to an upper wall surface of the storing container, for example, may be melted and dropped onto the SiC substrate.

In view of the circumstances described above, Patent Document 3 proposes a method in which a storing container has a tantalum silicide layer that is provided on an internal space side of the storing container, and the tantalum silicide layer is a supply source of Si vapor.

PRIOR-ART DOCUMENTS

Patent Documents

PATENT DOCUMENT 1: Japanese Patent Application Laid-Open No. 2011-233780
PATENT DOCUMENT 2: Japanese Patent Application Laid-Open No. 2008-230944
PATENT DOCUMENT 3: Japanese Patent Application Laid-Open No. 2014-103180

SUMMARY OF THE INVENTION

Problems to be Solved by the Invention

Recently, control of an rate of etching is regarded as important. For example, although a step bunching may be generated by heating a SiC substrate, it has been known whether the step bunching can be removed or not depends on the rate of etching. Here, when a Si vapor pressure etching is applied to a SiC manufacturing process, a technical problem with regard to the rate of etching of the SiC substrate in a treatment step of the SiC substrate for an epitaxial growth and in an activation annealing step of the SiC substrate having an epitaxial growth layer in which ions are implanted will be described.

Firstly, the treatment step of the SiC substrate for the epitaxial growth will be described. The SiC substrate can be obtained by cutting out of an ingot in a predetermined thickness. Since a surface roughness in a state of the SiC substrate that is cut out of the ingot is large, the surface needs to be planarized by performing the treatment steps such as mechanical polishing (MP) and chemical mechanical polishing (CMP). Although polishing scratches that remains on the surface of the SiC substrate are substantially removed by mechanical polishing and chemical mechanical polishing, a part of deep polishing scratches or a modified layer having disordered crystallinity that is formed by applying the pressure on the surface of the SiC substrate during mechanical polishing and chemical mechanical polishing (hereinafter, referred to as latent scratches) may remain. Since such polishing scratches or latent scratches may have several tens of μm of the depth in some cases, the higher rate etching is desired for efficiently removing the scratches.

In the activation step of the SiC substrate having the epitaxial growth layer in which ions are implanted, a sufficient temperature for replacing (activating) impurities (hereinafter, referred to as dopant) that are implanted as ions with a SIC crystal lattice location needs to be provided, and a dopant insufficient region having an insufficient dopant concentration that exists on the surface of the SiC substrate to a predetermined depth (about several tens to hundreds of nm-order) needs to be precisely removed by the etching. However, if the SiC substrate is excessively etched, a region having the sufficient dopant concentration is removed. Therefore, with respect to the SiC substrate having the epitaxial growth layer in which the ions are implanted, since the depth of etching needs to be accurately controlled with the rate of etching in which the step bunching is not generated, it is preferable to appropriately reduce the rate of etching.

The heating temperature, Si pressure, and inert gas pressure has been known as parameters relating to the rate of etching. However, since it may be considered that control of these parameters affects conditions other than the rate of etching, it is preferable that die rate of etching can be controlled by various methods.

The present invention has been made in view of the circumstances described above, a primary object is to provide an etching method for controlling the rate of etching of a SiC substrate based on a composition of a storing container.

Means for Solving the Problems and Effects Thereof

Problems to be solved by the present invention are as described above, and next, means for solving the problems and effects thereof will be described.

In a first aspect of the present invention, the following etching method of a SiC substrate is provided. That is, in the etching method, a SiC substrate that is stored in a storing container is heated under Si vapor pressure, and then the SiC substrate is etched. The storing container is formed of a tantalum metal, and has a tantalum carbide layer provided on an internal space side of the tantalum metal, and a tantalum silicide layer provided on the side further toward the internal space side than the tantalum carbide layer. Then, the rate of etching of the SiC substrate is controlled based on difference in a composition of the tantalum silicide layer.

Accordingly, the rate of etching can be controlled without changing a heating temperature, a Si pressure, and the like.

In the etching method of the SiC substrate, the tantalum silicide layer preferably includes any one of $TaSi_2$, $Ta_5Si_3$, $Ta_2Si$, $Ta_3Si$, $Ta_5Si_3C_{0.5}$.

Accordingly, the rate of etching can be controlled by using a general compound that is composed of Ta and Si.

In the etching method of the SiC substrate, two storing containers in which their compositions of the tantalum silicide layer are different from each other are used depending on the performed processes.

Accordingly, merely with the change of the storing containers, the process having a different required rate of etching can be performed without changing the temperature conditions and the like.

The etching method of the SiC substrate is preferably configured as follows. That is, high rate etching and low rate etching can be performed. In the high rate etching, the storing container having a higher ratio of tantalum occupied in one molecule of the compound for forming the tantalum silicide layer is used. In the low rate etching, the storing container having a lower ratio of tantalum occupied in one molecule of the compound for forming the tantalum silicide layer is used.

Accordingly, since carbon atoms in atmosphere are likely to be absorbed in a higher ratio of tantalum, the rate of etching is high. Therefore, as described above, either one of the storing containers is used, which can perform the etching at an appropriate rate.

In a second aspect of the present invention, the storing container that is used in the etching method of the SiC substrate is provided.

Accordingly, the storing container in which the rate of etching of the SIC substrate can be controlled without changing the heating temperature and the Si pressure and the like.

EMBODIMENT FOR CARRYING OUT THE INVENTION

Next, an embodiment of the present invention will be described with reference to the drawings. Firstly, referring to FIG. 1, a temperature vacuum furnace 10 used for a heat treatment of this embodiment will be described.

Figure 1:
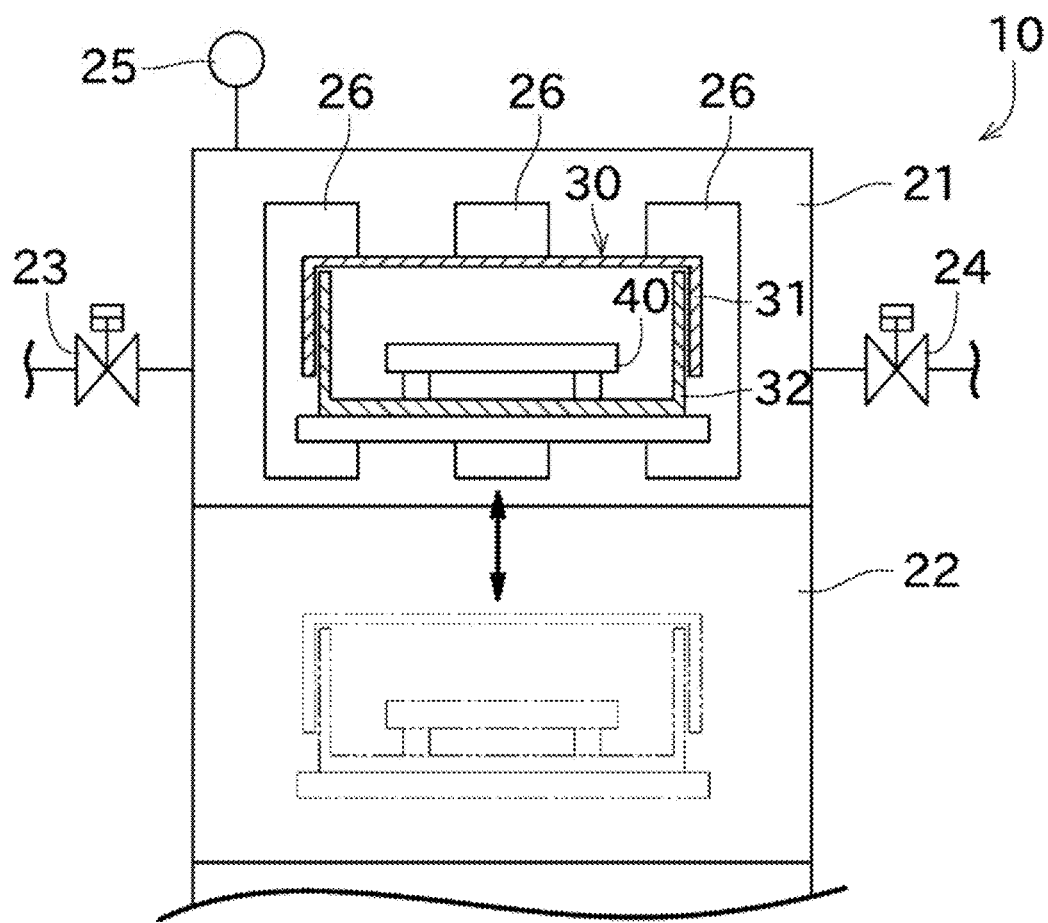
FIG. 1 is a diagram for illustration of an outline of a high temperature vacuum furnace for use in an etching method according to the present invention.

As shown in FIG. 1, the high temperature vacuum furnace 10 includes a main heating chamber 21 and a preheating chamber 22. The main heating chamber 21 is configured to heat a SiC substrate 40 (single crystal SiC substrate) made of, at least in its surface, single crystal SiC, up to a temperature of 1000° C. or more and 2300° C. or less. The preheating chamber 22 is a space for preheating a SiC substrate prior to heating of the SiC substrate 40 in the main heating chamber 21.

A vacuum-forming vat v 23, an inert gas injection valve 24, and a vacuum gauge 2 are connected to the main heating chamber 21. The vacuum-forming valve 23 is configured to adjust the degree of vacuum of the main heating chamber 21. The inert gas injection valve 24 is configured to adjust the pressure of an inert gas (for example, Ar gas) contained in the main heating chamber 21. The vacuum gauge 25 is configured to measure the degree of vacuum of the interior of the main heating chamber 21.

Heaters 26 are provided in the main heating chamber 21. A heat reflection metal plate (not shown) is secured to a side wall and a ceiling of the main heating chamber 21. The heat reflection metal plate is configured to reflect heat of the heaters 26 toward a central region of the main heating chamber 21. This provides strong and uniform heating of the SiC substrate 40, to cause a temperature rise up to 1000° C. or more and 2300° C. or less. Examples of the heaters 26 include resistive heaters and high-frequency induction heaters.

The SiC substrate 40 is heated while stored in a crucible (storing container) 30. The crucible 30 is placed on an appropriate support or the like, and the support is movable at least in a range from the preheating chamber to the main heating chamber. The crucible 30 includes an upper container 31 and a lower container 32 that are fittable with each other. Detailed configuration of the crucible 30 will be described later.

To perform a heat treatment of the SiC substrate 40, the crucible 30 is firstly placed in the preheating chamber 22 of the high temperature vacuum furnace 10 as indicated by the dot-dash lines in FIG. 1, and preheated at an appropriate temperature (for example, about 800° C.). Then, the crucible 30 is moved to the main heating chamber 21 whose temperature has been elevated to a set temperature (for example, about 1800° C.) in advance. After that, the SiC substrate 40 is heated while adjusting the pressure and the like. The preheating may be omitted.

Next, a composition of a wall surface of the crucible 30 and a method for forming a tantalum suicide layer will be described with reference to FIG. 2A-FIG. 3B.

Figure 2A:
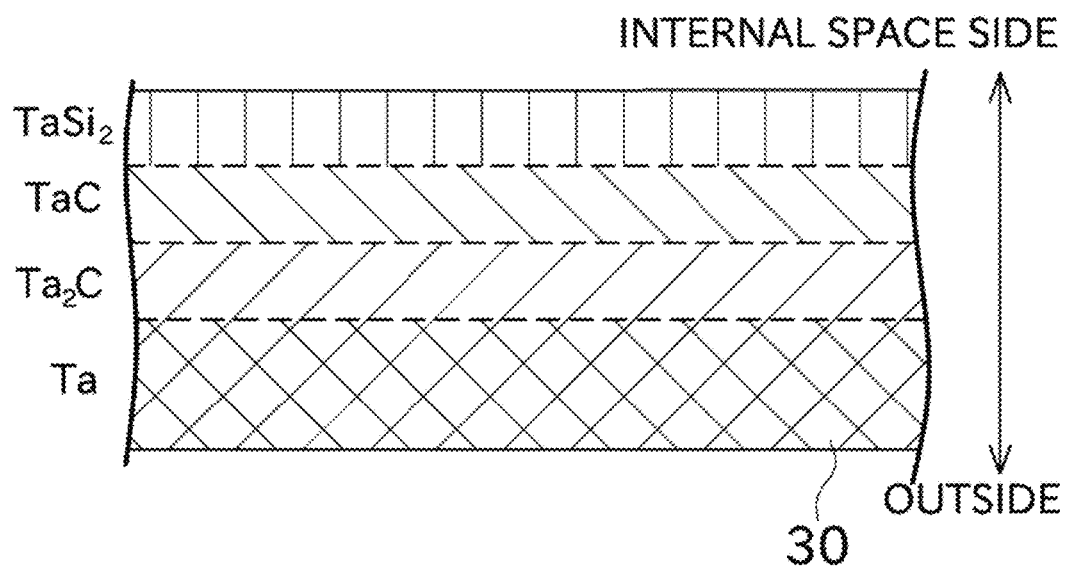
FIG. 2A and FIG. 2B respectively show a configuration of a wall surface of a crucible for a low rate etching and a X-ray diffraction pattern of the crucible.
Figure 2B:
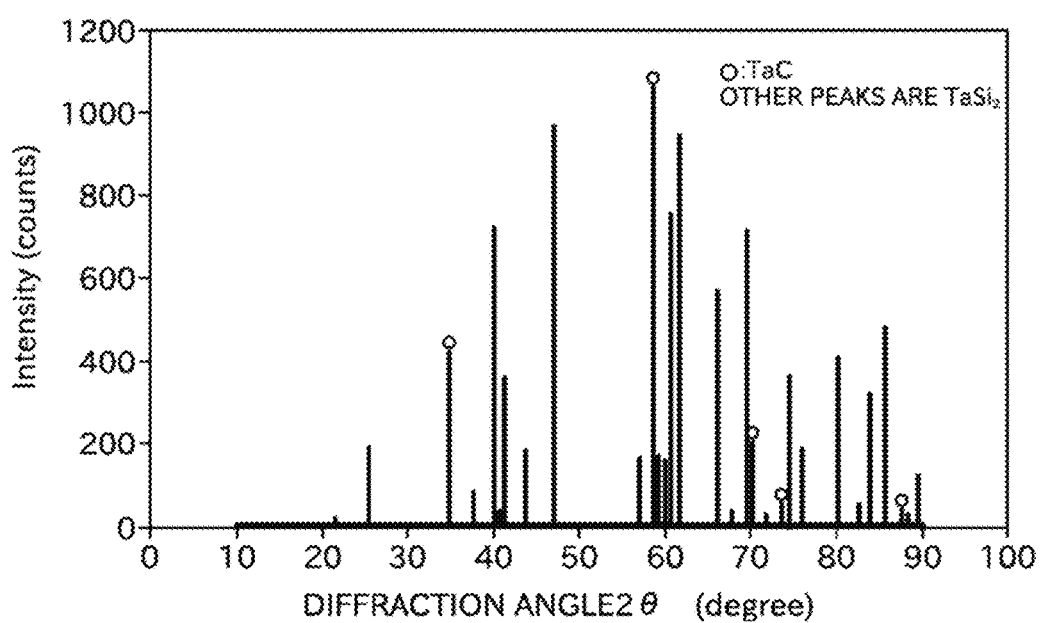

The crucible 30 has a configuration shown in FIG. 2A and FIG. 2B, in its portion constituting wall surfaces (an upper surface, a side surface, and a bottom surface) that define an internal space in which the SiC substrate 40 is stored. More specifically, a tantalum layer (Ta), a tantalum carbide layer (TaC and $Ta_2C$), and a tantalum silicide layer ($TaSi_2$, $Ta_5Si_3$ or the like) are provided in this order from the outside toward the internal space side.

The tantalum silicide layer supplies Si to the internal space. Since the crucible 30 includes the tantalum layer and the tantalum carbide layer, surrounding C vapor can be absorbed. Accordingly, a high-purity Si atmosphere can be caused in the internal space.

The crucible made of the tantalum layer and the tantalum carbide layer has been conventionally known. In this embodiment, the tantalum silicide layer is formed in the crucible. More specifically, Si that is vaporized at high temperature in advance is arranged in the internal space of the crucible, and heated for 15 minutes at 1800° C. under reduced pressure 10 Pa or less. Thereby, the tantalum silicide layer having a composition of $TaSi_2$ is formed as shown in FIG. 2A. FIG. 2B shows a X-ray diffraction pattern of the tantalum silicide layer that is formed as above. Peaks marked with circles in FIG. 2B shows tantalum carbide, and the other peaks show $TaSi_2$. As such, it can be seen that $TaSi_2$ is sufficiently formed by forming the tantalum suicide layer using the above-described method.

Figure 3A:
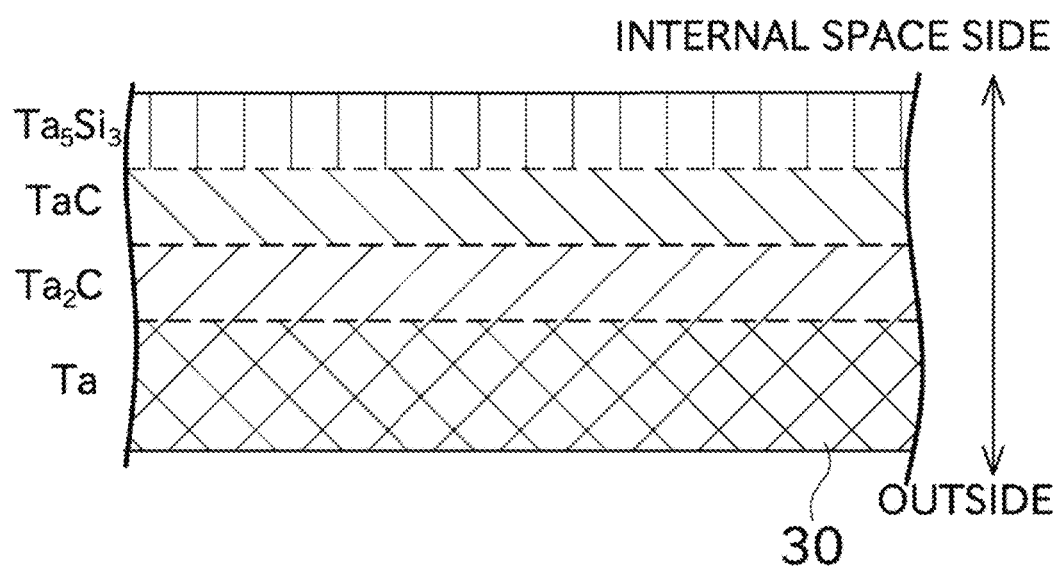
FIG. 3A and FIG. 3B respectively show a configuration of a wall surface of a crucible for a high rate etching and a X-ray diffraction pattern of the crucible.
Figure 3B:
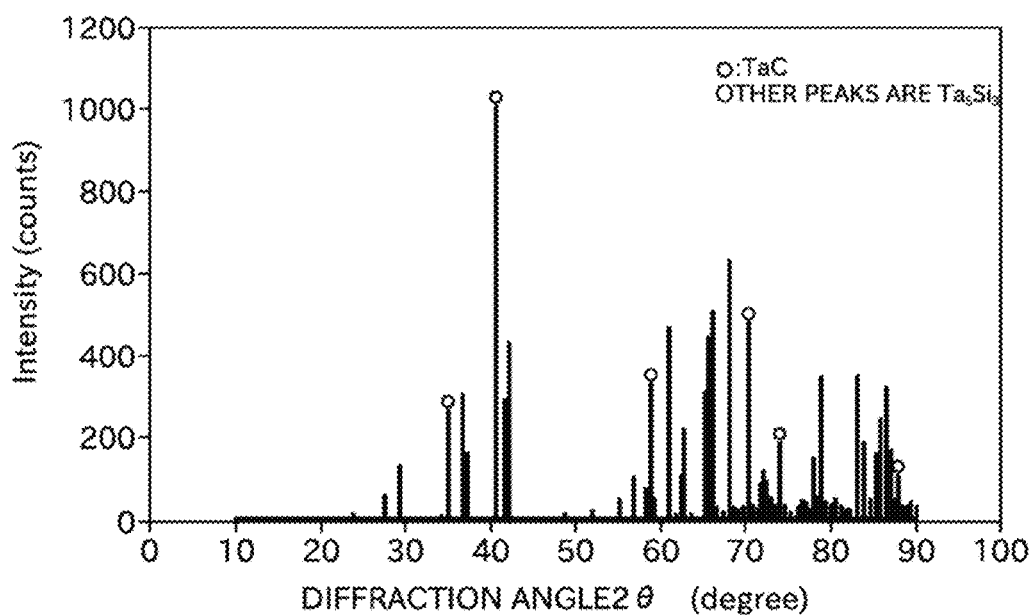

$Ta_5Si_3$ other than $TaSi_2$ can be also formed as the tantalum silicide layer (see FIG. 3A). In this case, Si that is vaporized in the same manner as above is introduced in the internal space of the crucible, and heated for 15 minutes at 2000° C. under reduced pressure 10 Pa or less. FIG. 3B shows a X-ray diffraction pattern of the tantalum silicide layer that is formed as above. Peaks marked with circles in FIG. 3B shows tantalum carbide, and the other peaks show $Ta_5Si_3$. As such, it can be seen that $Ta_5Si_3$ is sufficiently formed by forming the tantalum suicide layer using the above-described method.

Figure 4:
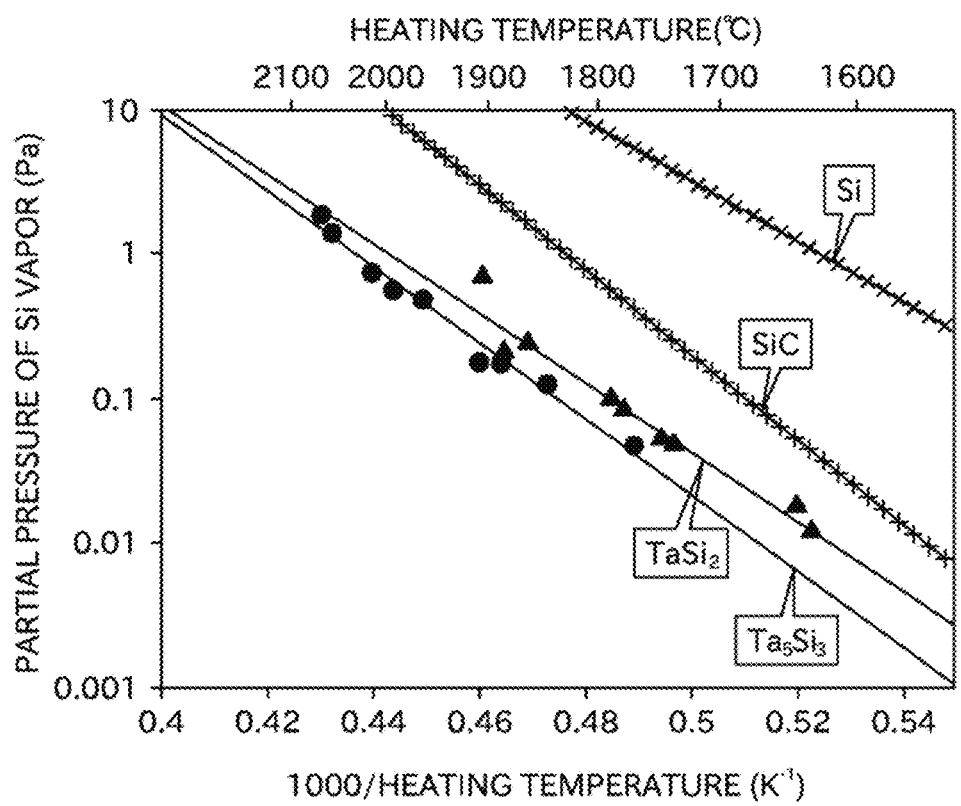
FIG. 4 is a graph showing a change of a partial pressure depending on a temperature of Si and Si compound.

FIG. 4 shows a graph showing a partial pressure of Si vapor pressure of Si, SiC, $TaSi_2$, and $Ta_5Si_3$. It can be seen that Si vapor pressure that is supplied from $TaSi_2$ and $Ta_5Si_3$ indicates a considerable high pressure. Therefore, it is clear that the tantalum silicide layer is a supply source of Si for the internal space of the crucible 30. The tantalum silicide layer is provided over an entire wall surface that defines the internal space. This allows the pressure distribution of Si pressure in the internal space to be uniform. Therefore, the SiC substrate 40 can be etched uniformly.

Figure 5:
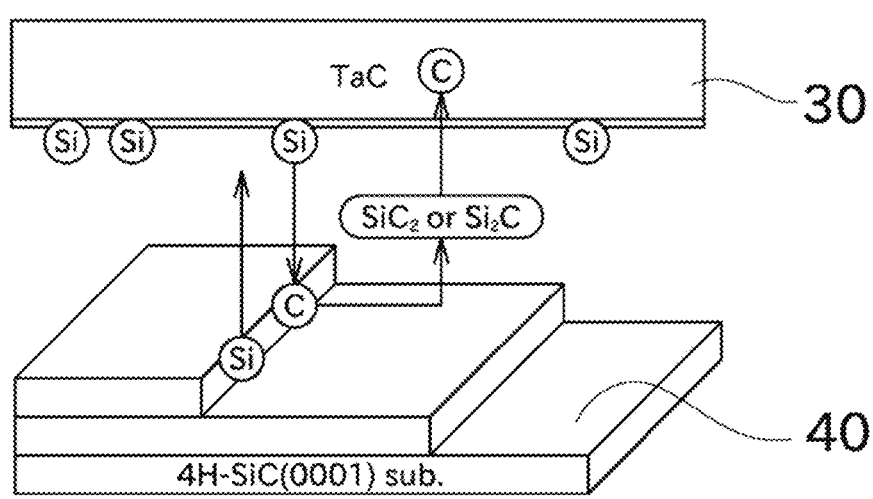
FIG. 5 is a schematic diagram for illustration of a carbon adsorption function of the crucible.

Next, Si vapor pressure etching that is performed in this embodiment (hereinafter, simply referred to as the etching) will be described, and difference in the rate of etching when using the crucible 30 having a different composition will be also described with reference to FIG. 5 and FIG. 6.

In this embodiment, the SiC substrate 40 stored in the crucible 30 is heated under high-purity Si vapor pressure up to a temperature of 1500° C. or more and 2200° C. or less and desirably 1600° C. or more and 2000° C. or less by using the high temperature vacuum furnace 10. This can etch the surface of the SiC substrate 40. In the etching, the following reactions are performed. Briefly, the SiC substrate 40 is heated under Si vapor pressure, and thereby Si vapor is eliminated from. SiC by thermal decomposition. Si vapor is supplied from the tantalum silicide layer. C that is remained by Si vapor eliminated by thermal decomposition reacts with Si vapor, and thereby sublimates into $Si_2C$ or $SiC_2$.

$$SiC(s) \rightarrow Si(v)I + C(s) \qquad (1)$$

$$Ta_xSi_y \rightarrow Si(v)II + Ta_{x'}Si_{y'} \qquad (2)$$

$$2C(s) + Si(v)I + II \rightarrow SiC_2(v) \qquad (3)$$

$$C(s) + 2Si(v)I + II \rightarrow Si_2C(v) \qquad (4)$$

When the above reactions continue, $SiC_2$ and $Si_2C$ that are generated in the chemical formulas (3) and (4) are excessive, which results in a decrease in the reaction rate of the chemical formulas (1) to (4). However, in this embodiment, when the crucible 30 shown in FIG. 2A and FIG. 2B is used, TaC and Si are generated by reacting between $SiC_2$ and $TaSi_2$. When the crucible 30 shown in FIG. 3A and FIG. 3B is used, $Ta_2C$ and $TaSi_2$ are generated by the reaction between $SiC_2$ and $Ta_5Si_3$. As such, C included in $SiC_2$ is absorbed in tantalum of the crucible 30 (see FIG. 5). When Si is generated, Si is used for the reaction for removing C atoms that remain in the SiC substrate 40 again. As described above, the etching continues to perform without reducing the reaction rate.

In consideration of the above, it can be seen that the rate of etching is closely relevant to the rate at which $SiC_2$ and $Si_2C$ absorb C atoms. Therefore, it is considered that the rate of etching is higher in accordance with the higher ratio of the amount of tantalum substance that is contained in the compound for forming the tantalum silicide layer. The pressure equilibrium constant of the reaction between $SiC_2$ and $TaSi_2$ is smaller than the pressure equilibrium constant of the reaction between $SiC_2$ and $Ta_5Si_3$. As above, it is considered that the rate of etching when using the crucible 30 having the tantalum silicide layer of $TaSi_2$ is slower than the rate of etching when using the crucible 30 having the tantalum silicide layer of $Ta_5Si_3$.

Figure 6:
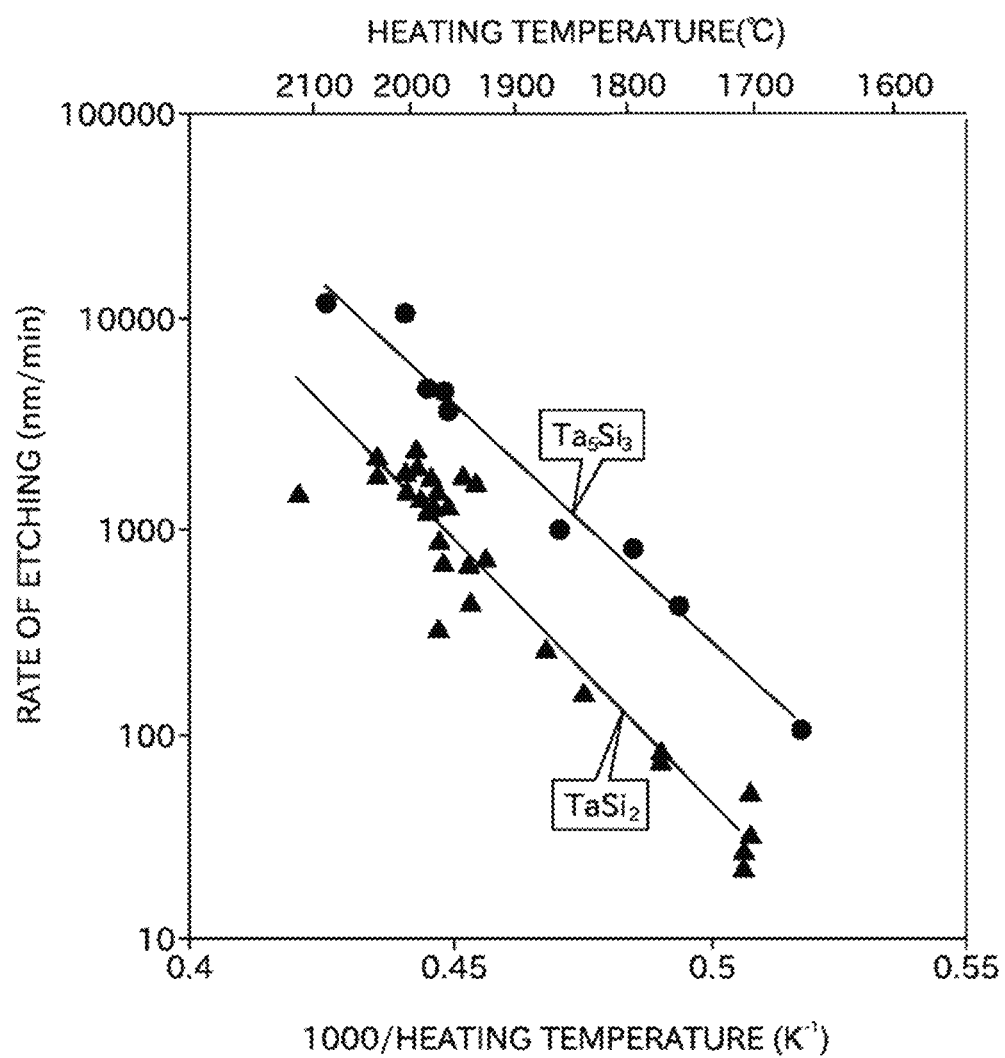
FIG. 6 is a graph comparing the rate of etching when using a crucible having an inner wall surface of $TaSi_2$ with the rate of etching when using a crucible having an inner wall surface of $Ta_3Si_5$.

FIG. 6 is a diagram showing a result when a 4H—SiC (0001) face having an off angle of 4° is etched in a temperature range from 1650° C. to 2100° C. under high vacuum ($10^{-4}$ Pa) in using the crucible 30 having the tantalum silicide layer of $TaSi_2$ and using the crucible 30 having the tantalum silicide layer of $Ta_5Si_3$. In a graph of FIG. 6, it is confirmed that the crucible 30 containing $TaSi_2$ has a considerably slower rate etching than that of the crucible 30 containing $Ta_5Si_3$.

As such, in this embodiment, the crucibles 30 having a different composition of the tantalum silicide layer are used, which can easily change the rate of etching without changing the heating temperature and the like. In the following, a specific situation for using the crucibles 30 will be described.

Figure 7:
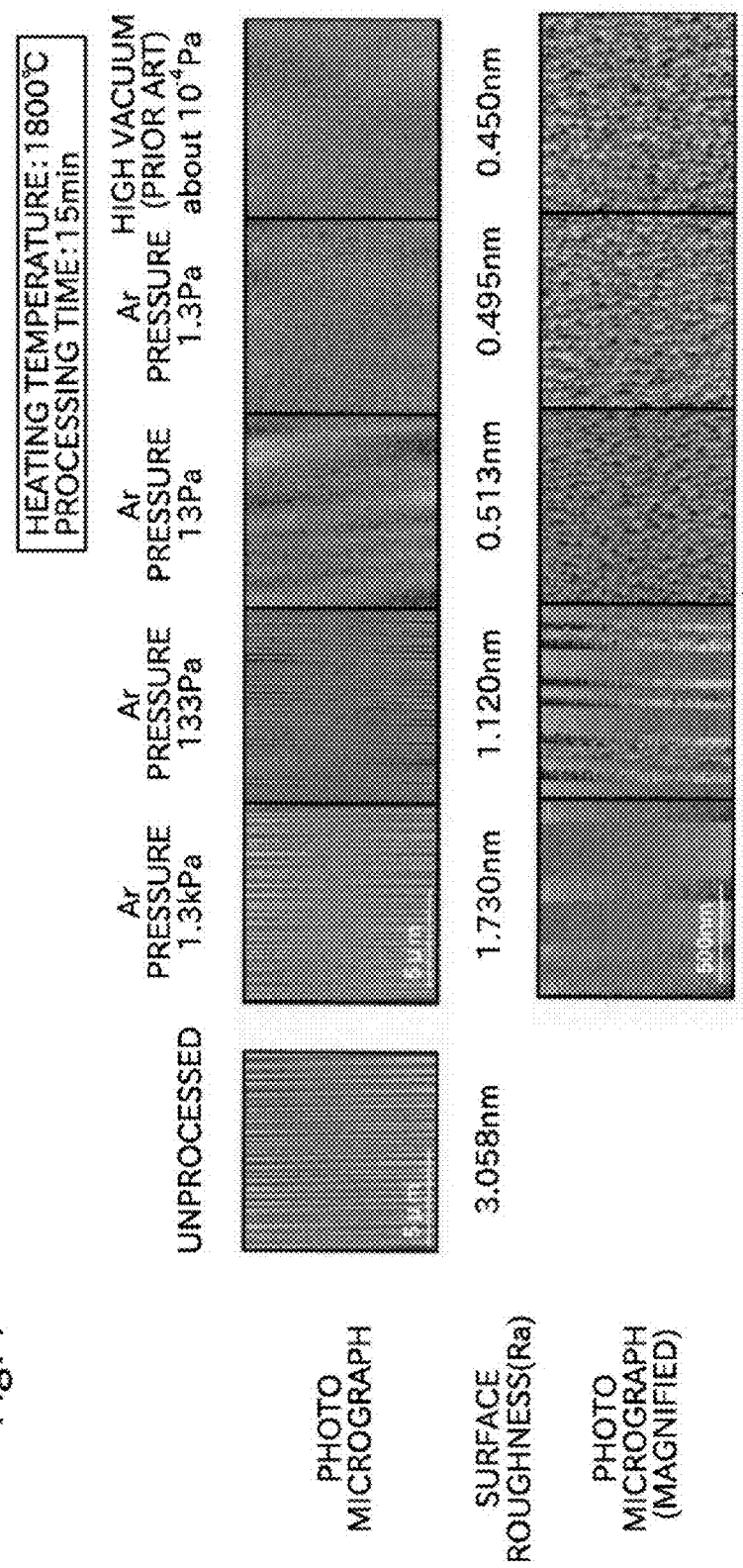
FIG. 7 is a diagram showing a photomicrograph and a surface roughness of a surface of a SiC substrate when the etching is performed with the change of an inert gas pressure in etching (that is, the rate of etching).

According to the experiment by the applicants, it was confirmed that a step bunching was removed by setting the rate of etching over a predetermined threshold, and in the rate of etching smaller than the predetermined threshold, the step bunching could not be removed even when the etching was performed for a long time. FIG. 7 is diagram showing a photomicrograph and a surface roughness of a surface of the SiC substrate 40 when the etching is performed with the change of an inert gas (Ar gas) pressure in etching (that is, the rate of etching). As shown in FIG. 7, under a condition of the experiment, when the inert gas pressure is 1.3 kPa, it can be seen by the photomicrograph that the surface roughness is large and the step bunching is clearly remaining. When the inert gas pressure is 133 Pa, it can be seen by the photomicrograph that the surface roughness is markedly reduced and the step bunching is partly removed. When the inert gas pressure is 13 Pa and 1.3 Pa under high vacuum, it can be seen by the photomicrograph that the surface roughness is further reduced and substantially entire step bunching is also removed. As such, whether or not the step bunching is removed can be selected in accordance with the inert gas pressure (that is, the rate of etching). In the SiC substrate 40 in which the step bunching not generated, local concentration or the like of the electric field does not occur. This leads to high performance as a semiconductor element. However, in the SIC substrate 40 in which the step bunching is generated, it is known that an effect of crystal defect (dislocation) can be further eliminated when the solution growth method is performed, for example. Therefore, it is preferable to switch the presence and absence of generation of the step bunching, depending the situations.

In this embodiment, since the rate of etching can be switched merely by using the crucible 30, the etching (high rate etching) is merely performed by using the crucible 30 having the tantalum silicide layer of $Ta_5Si_3$ when manufacturing the SIC substrate 40 in which the step bunching is not generated. On the other hand, the etching (low rate etching) is merely performed by using the crucible 30 having the tantalum silicide layer of $TaSi_2$ when manufacturing the SiC substrate 40 in which the step bunching is generated.

Next, another situation for using the crucibles 30 will be described. Firstly, in a treatment step of the SiC substrate 40 for an epitaxial growth, an ingot including 4H—SiC single crystal or 6H—SiC single crystal is cut out in a predetermined thickness. Thereafter, treatments such as mechanical polishing acid chemical mechanical polishing, etc. are performed for removing a surface roughness that is formed on the surface of the SiC substrate 40 in cutting. Since the surface roughness has considerably large difference in height, a high rate polishing of the SiC substrate 40 is needed. In addition, a modified layer having disordered crystallinity that is formed by applying the pressure on the surface of the SiC substrate 40 during mechanical polishing and the like (hereinafter, referred to as latent scratches) may have several tens of μm of the depth in some cases. In removing such latent scratches, a high rate polishing of the SiC substrate 40 is also needed. Therefore, the etching (high rate etching) can be performed easier than the conventional etching by using the crucible 30 having the tantalum silicide layer of $Ta_5Si_3$, instead of mechanical polishing and chemical mechanical polishing, etc. or in order to remove the latent scratches.

Figure 8:
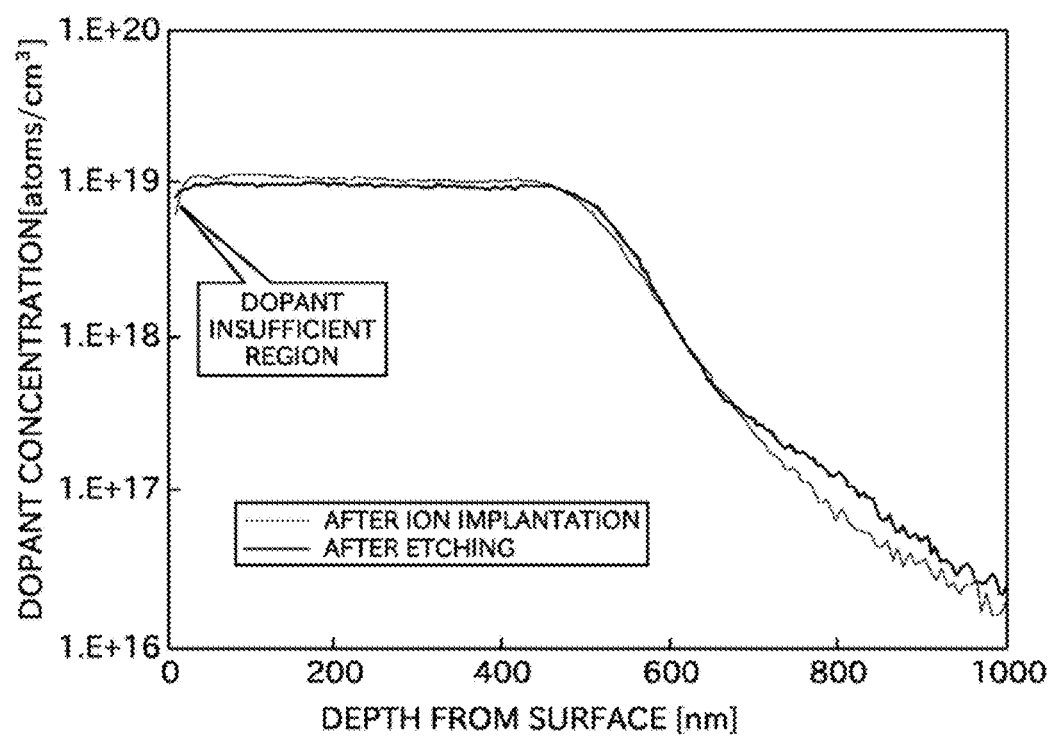
FIG. 8 is a graph showing a dopant concentration, particularly a dopant insufficient region, depending on a depth from the surface of the SiC substrate.

In an activation annealing step of the SiC substrate 40 having art epitaxial growth layer in which ions are implanted, an epitaxial layer growth, an ion implantation, and an activation of impurities implanted as ions (hereinafter, referred to as dopant) are performed with respect to the SiC substrate 40. Then, the etching is performed for removing a dopant insufficient region and planarizing the surface that is roughened by ion implantation. Specifically, the dopant insufficient region exists in a region from the surface of the SiC substrate 40 to a depth about several tens to hundreds of nm, for example, depending on the ion implantation conditions. FIG. 8 shows one example of the dopant concentration in accordance with the depth from the surface of the SiC substrate 40. In FIG. 8, there is low dopant concentration in a region from the surface to a depth of several tens of nm, and the dopant concentration decreases as the depth is deeper than about 500 nm. Therefore, since the amount of etching needs to be precisely controlled in order to remain a region having a sufficient dopant concentration while removing the dopant insufficient region, it is preferable to set a low rate etching. However, as described above, when the rate of etching is lower than the predetermined rate of etching, the step bunching cannot be removed. Therefore, in order to prevent a region having a sufficient dopant concentration from excessively removing, a precise etching (low rate etching) is merely performed by using the crucible 30 having the tantalum silicide layer of $TaSi_2$ under a condition that the step bunching is not generated.

Accordingly, the crucibles 30 having a different composition of the tantalum silicide layer are used in removing the latent scratches and in etching after ion implantation, which can perform the etching at an appropriate rate of etching without significantly changing the heating temperature and the like.

As described above, in the etching method of this embodiment, the SiC substrate 40 stored in the crucible 30 is etched by heating under Si vapor pressure. The crucible 30 is formed of a tantalum metal, and has a tantalum carbide layer provided on an internal space side of the tantalum metal, and a tantalum silicide layer provided on the side further toward the internal space side than the tantalum carbide layer. Then, the rate of etching of the SiC substrate 40 is controlled based on difference in a composition of the tantalum silicide layer.

Accordingly, the rate of etching of the SiC substrate 40 can be controlled without hanging the heating temperature and the Si pressure.

In the etching method of the SiC substrate 40 of this embodiment, at least two crucibles 30 in which their compositions of the tantalum silicide layer are different from each other (to be specific, $TaSi_2$ and $Ta_5Si_3$) are used depending on performed processes.

Accordingly, merely with the change of the crucible 30, the processes having a different required rate of etching can be performed without changing the temperature conditions or the like.

In the etching method of the SiC substrate 40 of this embodiment, high rate etching and low rate etching can be performed. In the high rate etching, the crucible 30 having a higher ratio of tantalum occupied in one molecule of the compound for forming the tantalum silicide layer (to be specific, $Ta_5Si_3$) is used. In the low rate etching, the crucible 30 having a lower ratio of tantalum occupied in one molecule of the compound for forming the tantalum silicide layer (to be specific, $TaSi_2$) is used.

Accordingly, since carbon atoms in atmosphere are likely to be absorbed in a case of a higher ratio of tantalum, the rate of etching is high. Therefore, as described above, either one of the crucibles 30 is used, which can perform the etching at an appropriate rate.

Although a preferred embodiment of the present invention has been described above, the above-described configuration can be modified, for example, as follows.

Figure 9:
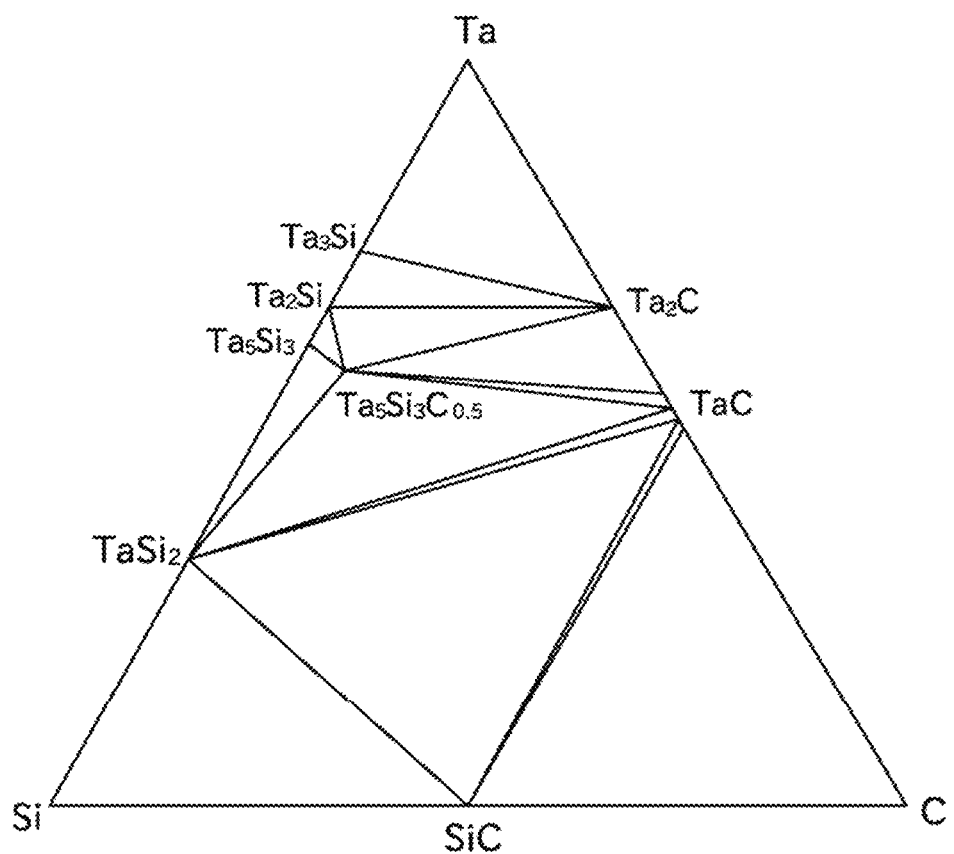
FIG. 9 is a phase diagram of Ta—C—Si.

In the above-described embodiment, although $TaSi_2$ and $Ta_5Si_3$ are formed as a tantalum silicide, the tantalum silicide represented by other chemical formula may be also adoptable. For example, as shower in a phase diagram of FIG. 9, $Ta_2Si$, $Ta_3Si$ or $Ta_5Si_3C_{0.5}$ may be formed. In the specification, it may be considered as the tantalum silicide layer even if other atoms are included like $Ta_5Si_3C_{0.5}$.

In the above-described embodiment, although a tantalum silicide having a same composition is formed over the entire inner wall of one crucible 30, the tantalum silicide having a plurality of kinds of compositions may be formed on the inner wall of one crucible 30. In this case, the rate of etching on only a part of the surface of the SiC substrate 40 can be high or low. In consideration of such rate of etching, the SiC substrate 40 having a desired shape can be created.

The above-described temperature conditions, pressure conditions and the like are merely illustrative ones, and can be modified as appropriate. A heating apparatus other than the above-described high temperature vacuum furnace 10 may be used, or a container having shapes or materials different from the crucible 30 may be used. For example, an external shape of the storing container is not limited to a cylindrical shape, and may have a cubic shape or a rectangular parallelepiped shape.

DESCRIPTION OF THE REFERENCE NUMERALS 10 high temperature vacuum furnace
30 crucible (storing container)
40 SiC substrate
The invention claimed is:
1. An etching method for etching a SiC substrate that is stored in a storing container, by heating the SiC substrate under Si vapor pressure, wherein
   the storing container is formed of a tantalum metal, and a tantalum carbide layer is provided on an internal space side of the tantalum metal, and a tantalum silicide layer is provided on the side further toward the internal space side than the tantalum carbide layer, and the rate of etching of the SiC substrate is controlled based on a difference of a ratio of the amount of tantalum substance that is contained in the compound for forming the tantalum silicide layer, wherein at least two storing containers in which compositions of the tantalum silicide layer are different from each other are used depending on performed processes, wherein a high rate etching and low rate etching can be performed, in the high rate etching, a storing container having a higher ratio of tantalum occupied in one molecule of a compound for forming the tantalum silicide layer is used, and in the low rate etching, a storing container having a lower ratio of tantalum occupied in one molecule of the compound for forming the tantalum silicide layer is used.

2. The etching method of the SiC substrate according to claim 1, wherein the tantalum silicide layer includes any one of $TaSi_2$, $Ta_5Si_3$, $Ta_2Si$, $Ta_3Si$, and $Ta_5Si_3C_{0.5}$.

* * * * *